United States Patent
Lee (10) Patent No.: US 7,197,673 B2
(45) Date of Patent: Mar. 27, 2007

(54) MEMORY INTERLACE-CHECKING METHOD

(75) Inventor: Chen-Tsai Lee, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 790 days.

(21) Appl. No.: 09/886,225

(22) Filed: Jun. 21, 2001

(65) Prior Publication Data

US 2002/0078407 A1    Jun. 20, 2002

(30) Foreign Application Priority Data

Dec. 14, 2000  (TW) .............................. 89126697 A (51) Int. Cl.
G11C 29/00    (2006.01)
(52) U.S. Cl. ...................... 714/718; 714/720
(58) Field of Classification Search ................ 714/702, 714/763, 718–720; 364/200; 365/201, 189.11, 365/190, 203, 222, 220–221
See application file for complete search history.

(56) References Cited

U.S. PATENT DOCUMENTS

| 4,513,374 A | * | 4/1985 | Hooks, Jr. ................... 364/200 |
| 5,297,242 A | * | 3/1994 | Miki ............................. 710/22 |
| 5,748,545 A | * | 5/1998 | Lee et al. ................... 365/201 |

* cited by examiner

Primary Examiner—Guy J. Lamarre
(74) Attorney, Agent, or Firm—Jianq Chyun IP Office (57) ABSTRACT

The present invention relates to a memory interlace-checking method and, in particular, to a test method that can effectively detect the weakening of memory. This test method is different from the conventional continuous address testing style. It is an interlacing address test method that comprises a main step and a data checking step. The main step provides main data to perform command actions on local addresses in memory. This will weaken other portions in the memory that are not trigged by commands because of the electromagnetic interference (EMI) induced by memory operations. Afterwards, in the data checking step, the yet to be triggered portion will be checked in a complementary way in order to accurately detect weakened memory.

7 Claims, 17 Drawing Sheets

SYMBOL OF Y PHASE INVERT X DUAL FORK WALKING

Y PHASE INVERT X DUAL FORK WALKING

X PHASE WALKING

SYMBOL OF X PHASE WALKING

FIG.6A
PRIOR ART

SYMBOL OF X PHASE WALKING

X PHASE WALKING

SYMBOL OF INVERT X
PHASE INVERT Y WALKING

INVERT X PHASE INVERT Y
WALKING

FIG.7B
PRIOR ART

SYMBOL OF PHASE WALKING

Y PHASE WALKING

FIG.8A
PRIOR ART

SYMBOL OF Y PHASE INVERT X WALKING

Y PHASE INVERT X WALKING

MEMORY INTERLACE-CHECKING METHOD

BACKGROUND OF THE INVENTION

1. Field of Invention

The present invention relates to a memory interlace-checking method, which is a test method that can detect weakened memory. Through interlacing data accesses, the method can more accurately find memory problems.

2. Related Art

Memory is an indispensable element in a computer system. It has a deterministic influence on the stability of the system. As the capacity and speed of the memory increase indefinitely, the current memory manufacturing technologies reach a scale below 0.2 micrometers, a supply voltage below 3.3 volts, and an operation speed over 133 MHz. Under such a high density, a low operation voltage and a high operation frequency, memory becomes very sensitive and is easily damaged or weakened because of the manufacturing process, external signals or noise generated inside, resulting in low stability. Therefore, how to accurately quickly detect the memory weakening problem is an important subject studied by test engineers.

According to the current state of the art in memory testing, there is a problem of being unable to accurately detect memory weakening or instability. Usual memory testing programs perform complicated state settings and data accesses through the command pins, address pins, I/O pins of the memory to detect whether each element in the memory is good or not. Taking data accessing as an example, if one wants to check the continuity of a particular word line (W/L) in the memory, the result can be obtained by employing a one-dimensional row access pattern to access the particular W/L. If one wants to check the continuity of a particular bit line (B/L) in the memory, the result can be obtained by employing a one-dimensional column access pattern to access the particular B/L. In addition, A. J. van de Goor discloses other methods such as a two-dimensional checkerboard, the GALPAT, a sliding diagonal scheme and a butterfly pattern in *Testing Semiconductor Memory* (John Wiley & Sons, 1991) to provide better error detection effects.

Figure 6A:
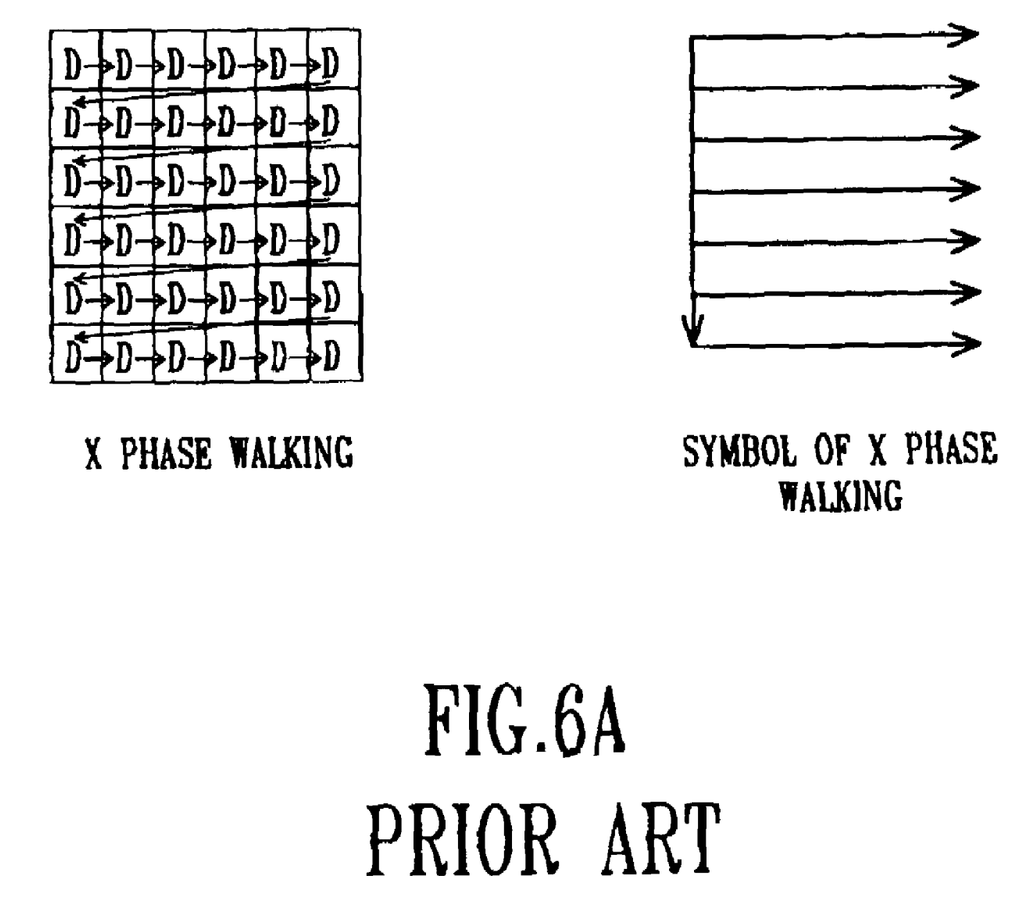
Figure 6B:
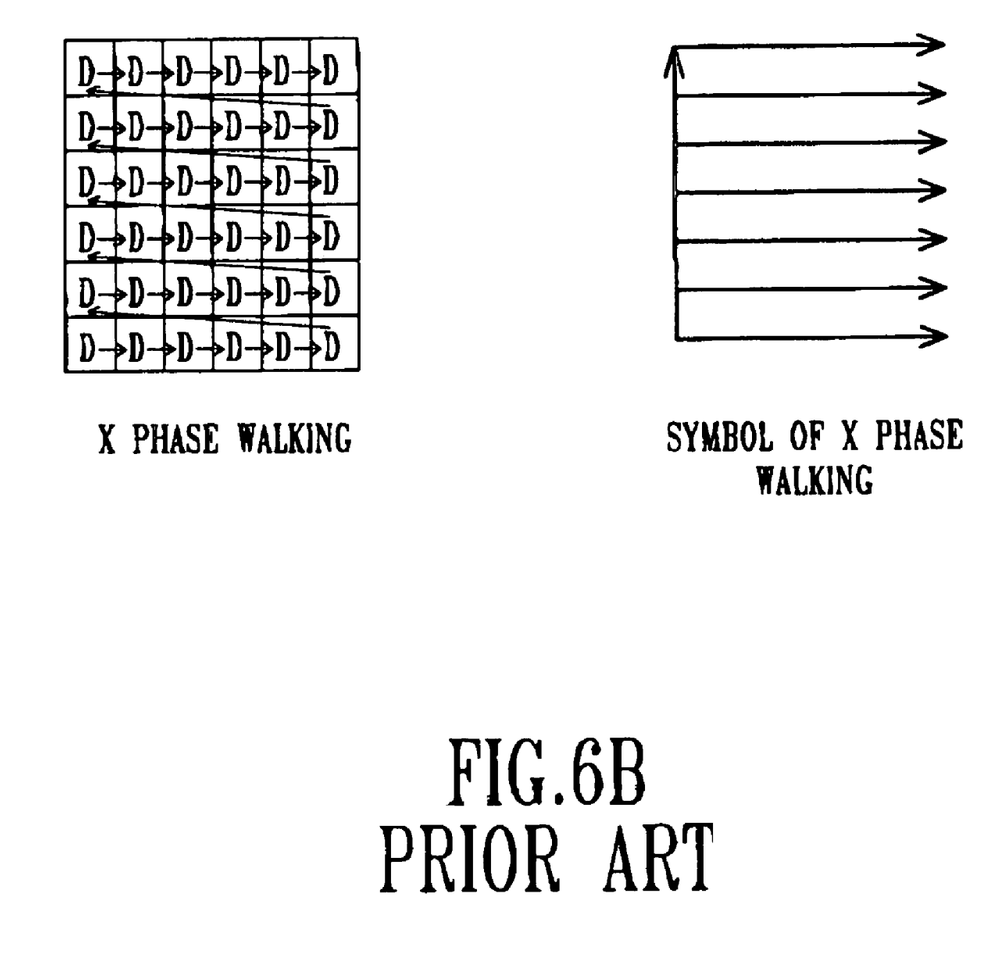
Figure 7A:
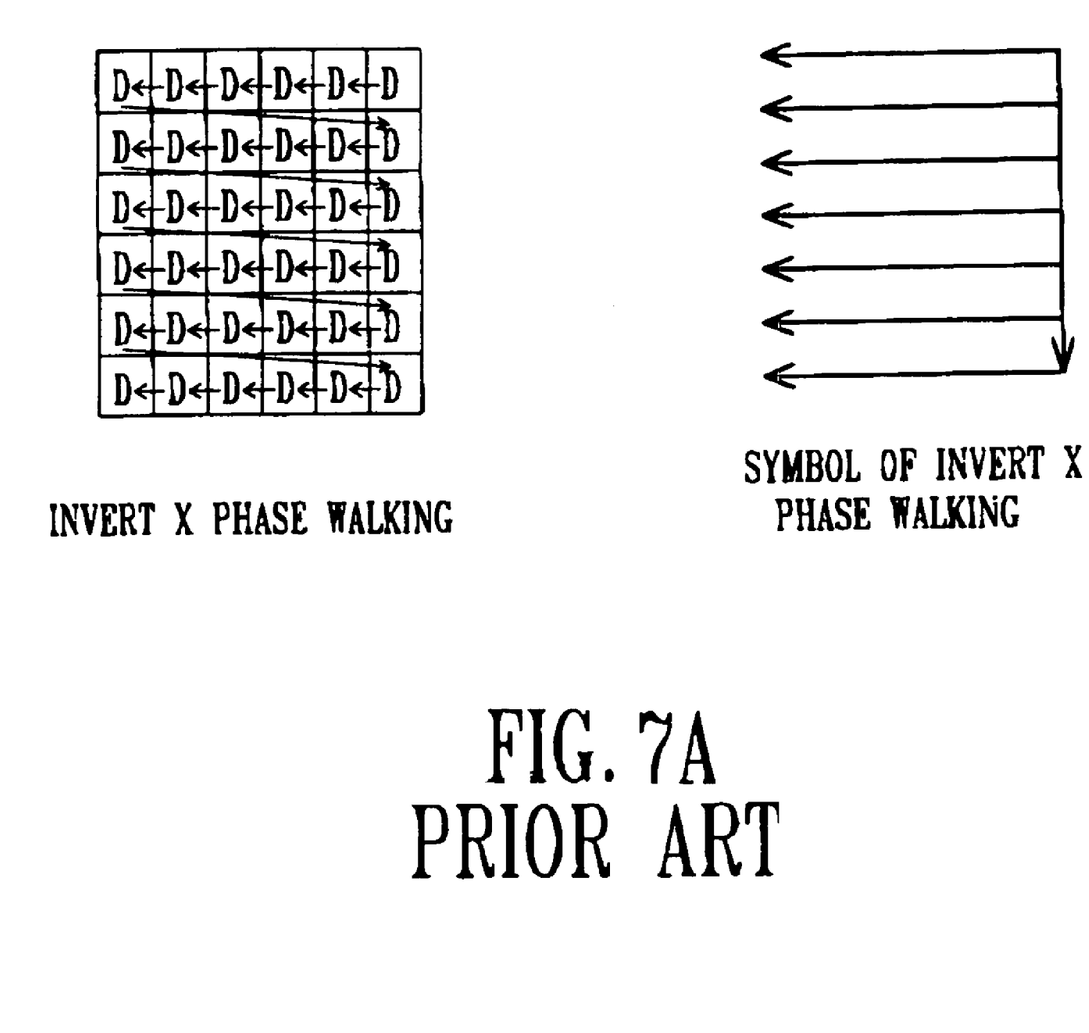
Figure 7B:
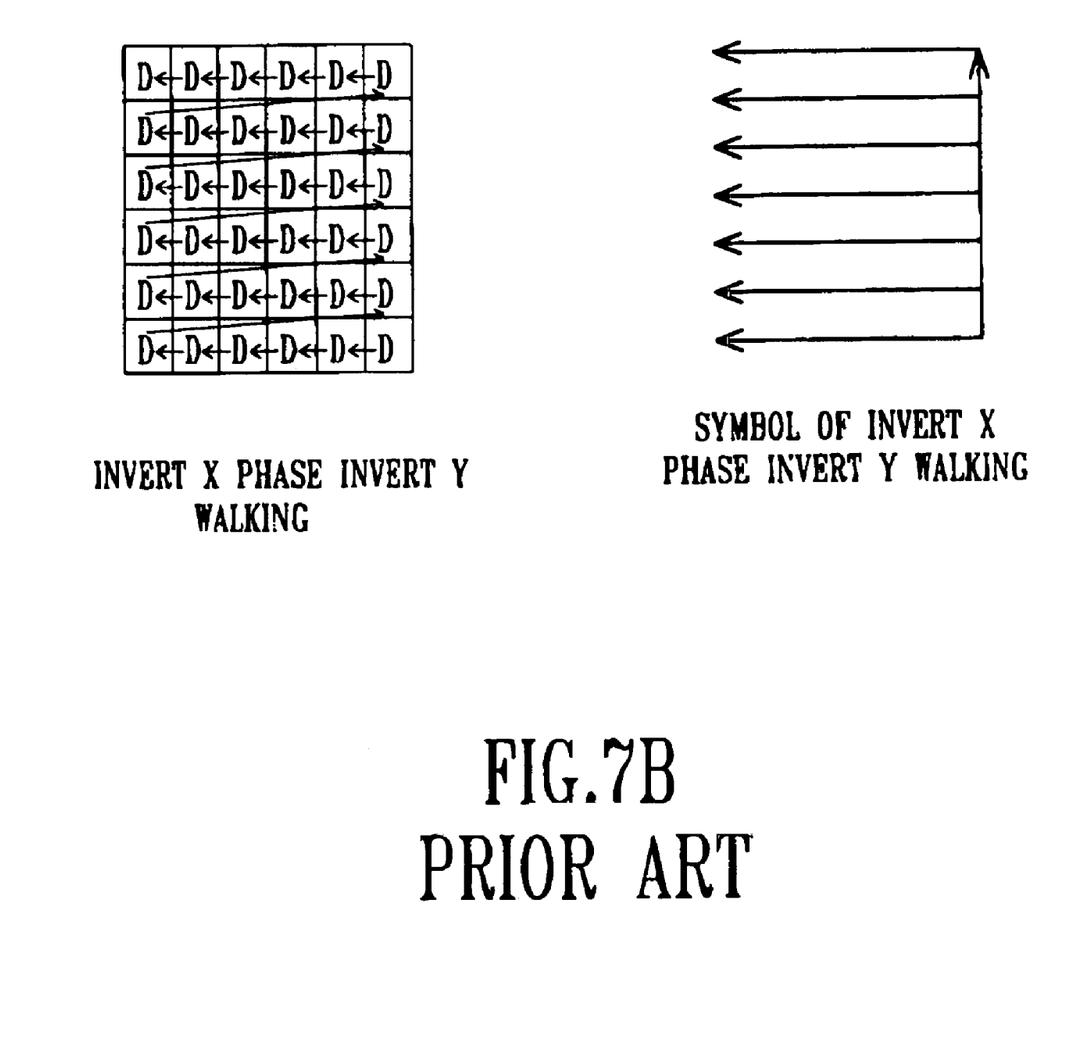
Figure 8A:
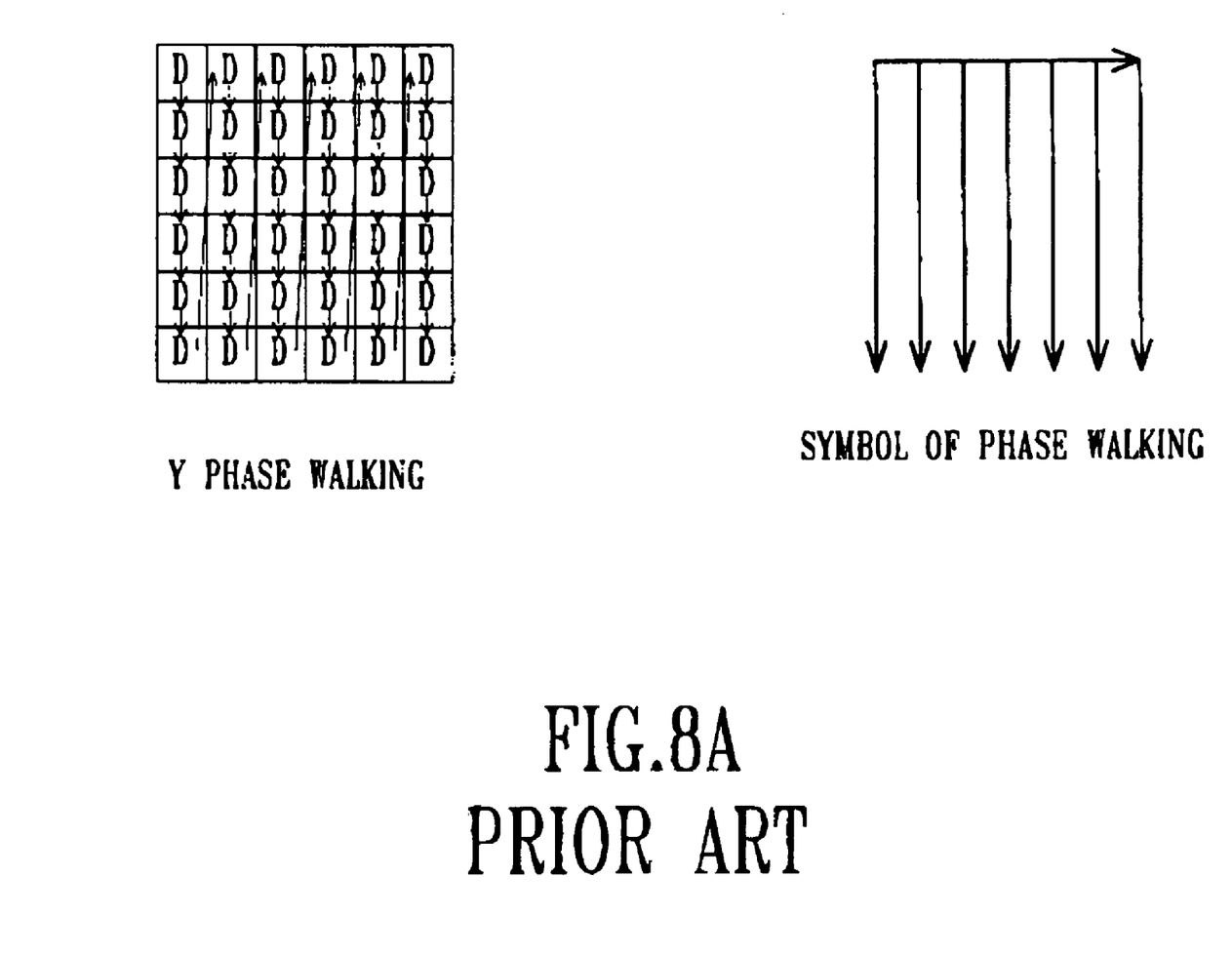
Figure 8B:
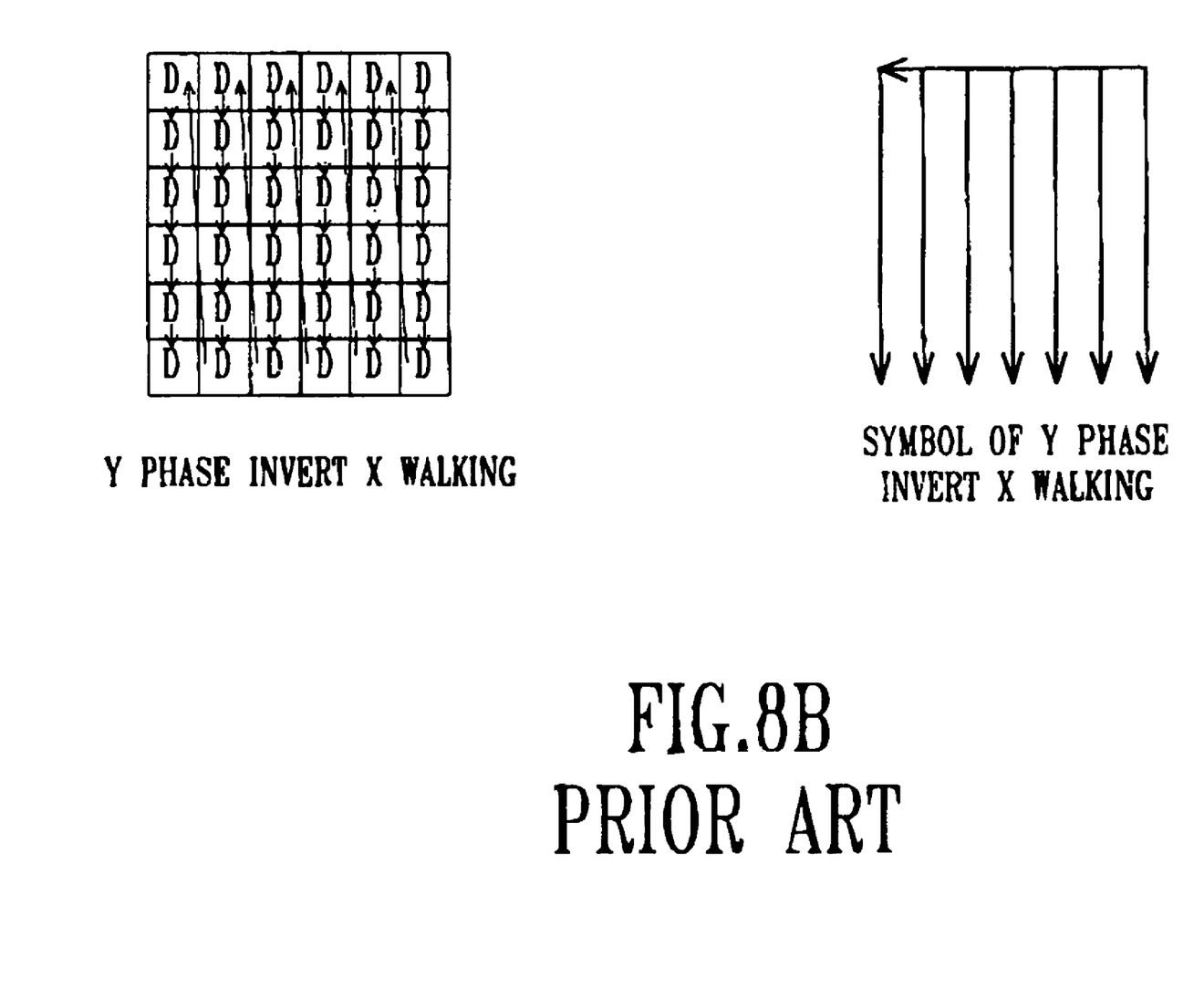
Figure 9A:
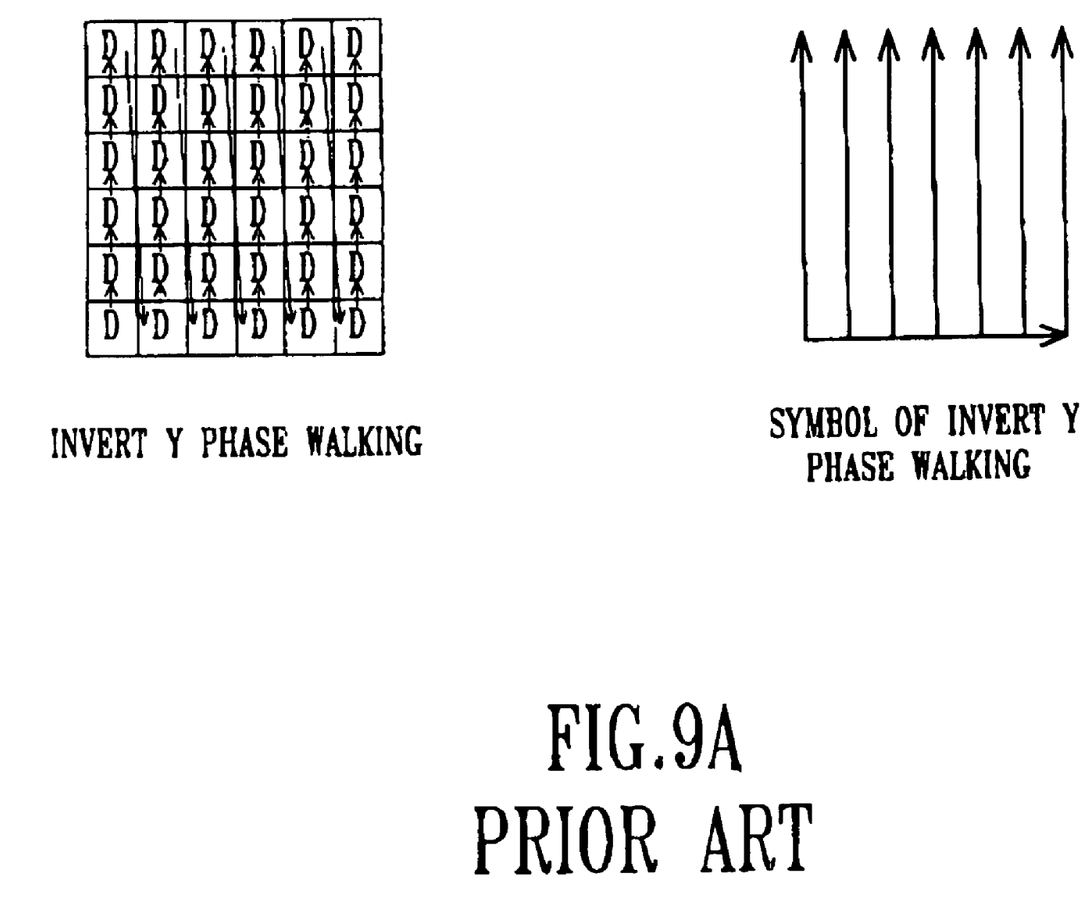
Figure 9B:
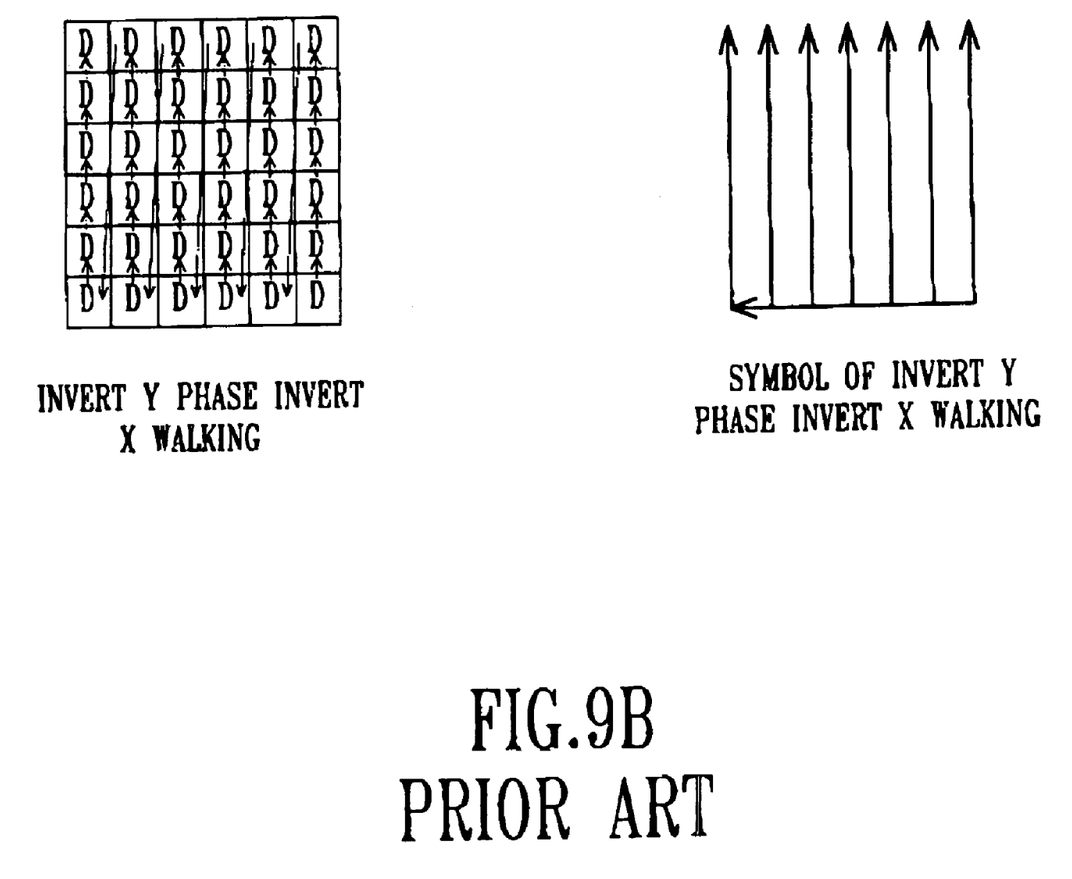

Although conventional methods have many different memory testing styles, the memory address accessing, however, is more or less the same. As shown in FIG. 6A, the matrix on the left-hand side of the drawing represents the memory. Each little square refers to a memory cell. On the right-hand side is a simplified way of showing the ordering of addresses. In FIG. 6A, continuous address accessing is performed from left to right and then from top to bottom. Another method from bottom to top is employed in FIG. 6B. FIGS. 7A and 7B show the memory address accessing performed from right to left and then from top to bottom and from bottom to top, respectively. FIGS. 8A and 8B show the memory address accessing performed from top to bottom and then from left to right and from right to left, respectively. FIGS. 9A and 9B show the memory address accessing performed from bottom to top and then from left to right and from right to left, respectively. However, no matter what memory accessing scheme is taken, it is still a vertical or horizontal continuous access style (read, write or refresh). This kind of one bit by one bit access method cannot effectively detect memory weakening problems. That is, as shown in FIG. 6A, when accessing the first row from left to right, electromagnetic interference (EMI) may result in weakening in the next row. However, after finishing the access of the first row and starting the access of the second row, the second row may be strengthened from a weakened state to a normal state due to write-in, read or refresh. Therefore, the foregoing continuous memory address accessing scheme cannot effectively detect the memory weakening problems. The conventional memory test methods are neither stringent nor accurate and thus have to be improved.

SUMMARY OF THE INVENTION

One objective of the invention to provide a memory interlace-checking method, which can accurately detect memory weakening problems.

Another objective of the invention to provide a memory interlace-checking method, which is not only applicable to normal DRAM but also to the new generation of DDR-DRAM and RDRAM.

Yet another objective of the invention to provide a memory interlace-checking method consisting of a main step and a data checking step. The main step performs command actions only on local memory (such as even rows or columns, or odd rows or columns). The data checking step checks the portion in the memory that is not triggered in the previous step so as to accurately determine whether the memory has a weakening problem. This method can thus solve the problem of being unable to stringently and accurately detect weakening problems in the conventional tests.

A further objective of the invention to provide a memory interlace-checking method that has a main step and a data checking step. The memory addresses in the main step and the data checking step are complementary to each other. In practice, the memory address accessing can be performed from left to right, from right to left, from top to bottom or from bottom to top.

The memory interlace-checking method in accordance with the present invention includes: a main step having at least a main datum, which performs command actions on the memory address row or column; a data checking step having at least a data check datum, which checks memory rows or columns not triggered in the main step; wherein by accessing particular memory rows or columns, other yet to be triggered memory rows or columns may be weakened by electromagnetic interference (EMI) and thus can be accurately detected in the data checking step.

BRIEF DESCRIPTION OF THE DRAWINGS

FIGS. 6A, 6B through 9A, 9B are schematic views of conventional memory address accessing methods.

DETAILED DESCRIPTION OF THE INVENTION

The test method in accordance with the present invention can more accurately detect memory weakening problems. This method is different from conventional address accessing continuous sequential address accessing. The present invention uses an interlacing data access technique. The method in accordance with the present invention is composed of at least two steps: the main step and the data checking step. In the main step, there are main data for executing commands. The data perform the write, read, or refresh command in local addresses in the memory (such as from left to right or from right to left in odd or even columns or rows). While accessing the odd columns (rows), the yet to be accessed memory addresses, i.e., the even columns (rows), are weakened by the electromagnetic interference (EMI) induced from the previously mentioned command actions. Afterwards, the data checking step provides checking commands that checks addresses yet to be triggered in the main step, i.e., the even columns (rows). This can readily detect weakened elements. So the present invention provides a method that can more accurately determine whether memory is weakened.

Figure 1A:
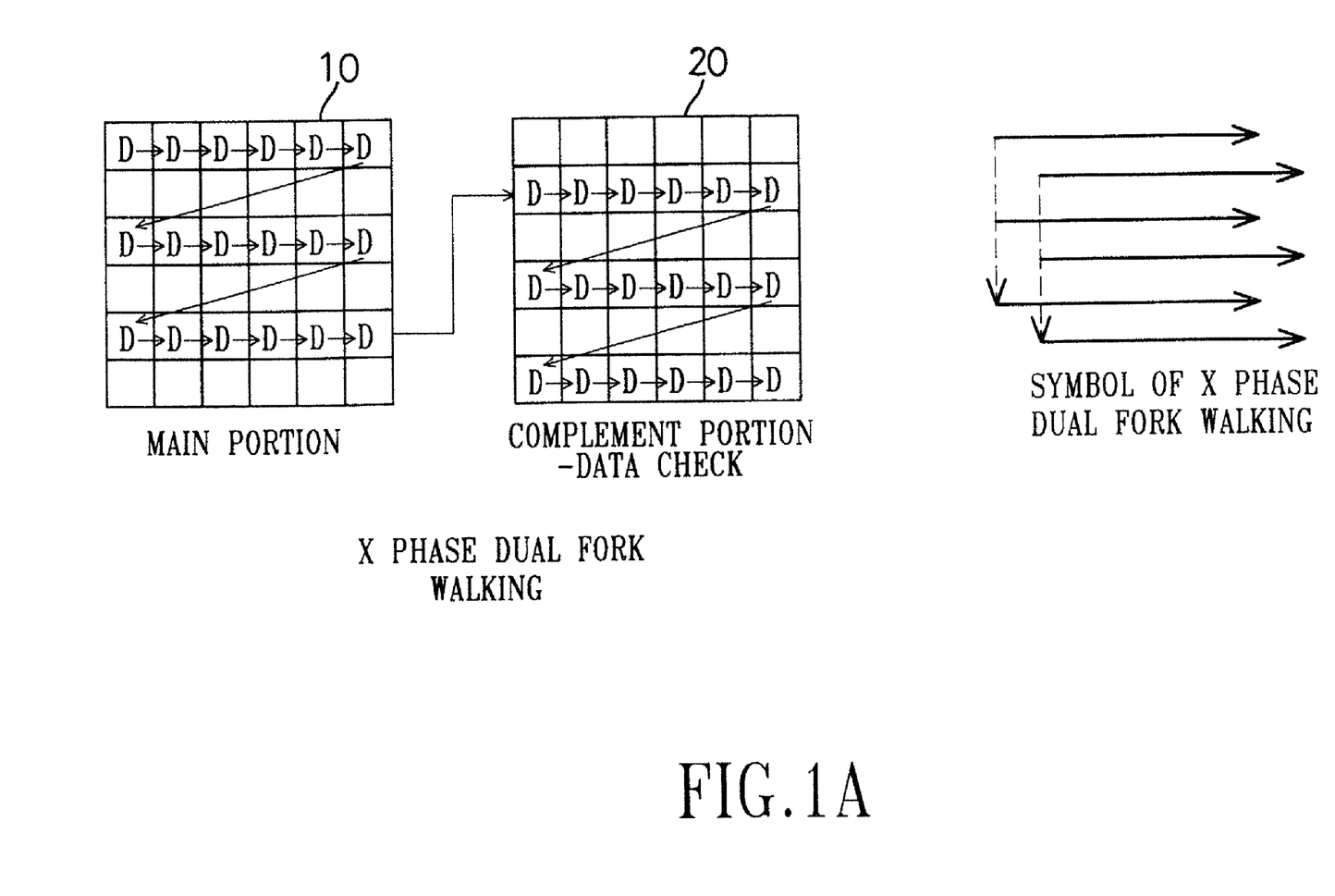
FIGS. 1A and 1B is a diagram of a first embodiment of the memory interlace-checking method in accordance with the present invention using left to right passes.

The actual implementation of the present invention does not have extra limitation as long as the memory accesses are interlacing. That is, there are many different embodiments of the invention. The left hand side and central portion of FIG. 1A show the memory access sequence and order in the main step 10 and the data checking step 20, respectively, of a first embodiment of the memory interlace-checking method. The arrow indicates the direction. "D" in the drawing refers to the action location. The right hand side of the drawing shows a simplified action sequence. Therefore, according to FIG. 1A, the main step 10 performs command actions on the odd rows (1, 3, 5 . . . ) of the memory from left to right and progressing from row to row in a top to bottom sequence. The command actions include writing, reading and refreshing. Such actions will induce circuit actions inside the memory and the resultant EMI. After the main step 10 is completed, the data checking step 20 checks the memory rows that have not been accessed in the main step, also from left to right and from top to bottom. These are the even rows (2, 4, 6 . . . ) shown in the central portion of FIG. 1A. The main step and the data checking step can also be understood from the simplified diagram on the right hand side of FIG. 1A.

During the main step 10 in FIG. 1A, the odd rows of memory are triggered, and the corresponding positions in the adjacent even rows will be affected by EMI. Therefore, in performing the data checking step 20, the problem of memory weakening will become apparent as the corresponding memory element is accessed. The weakened memory elements can then be detected.

Figure 1B:
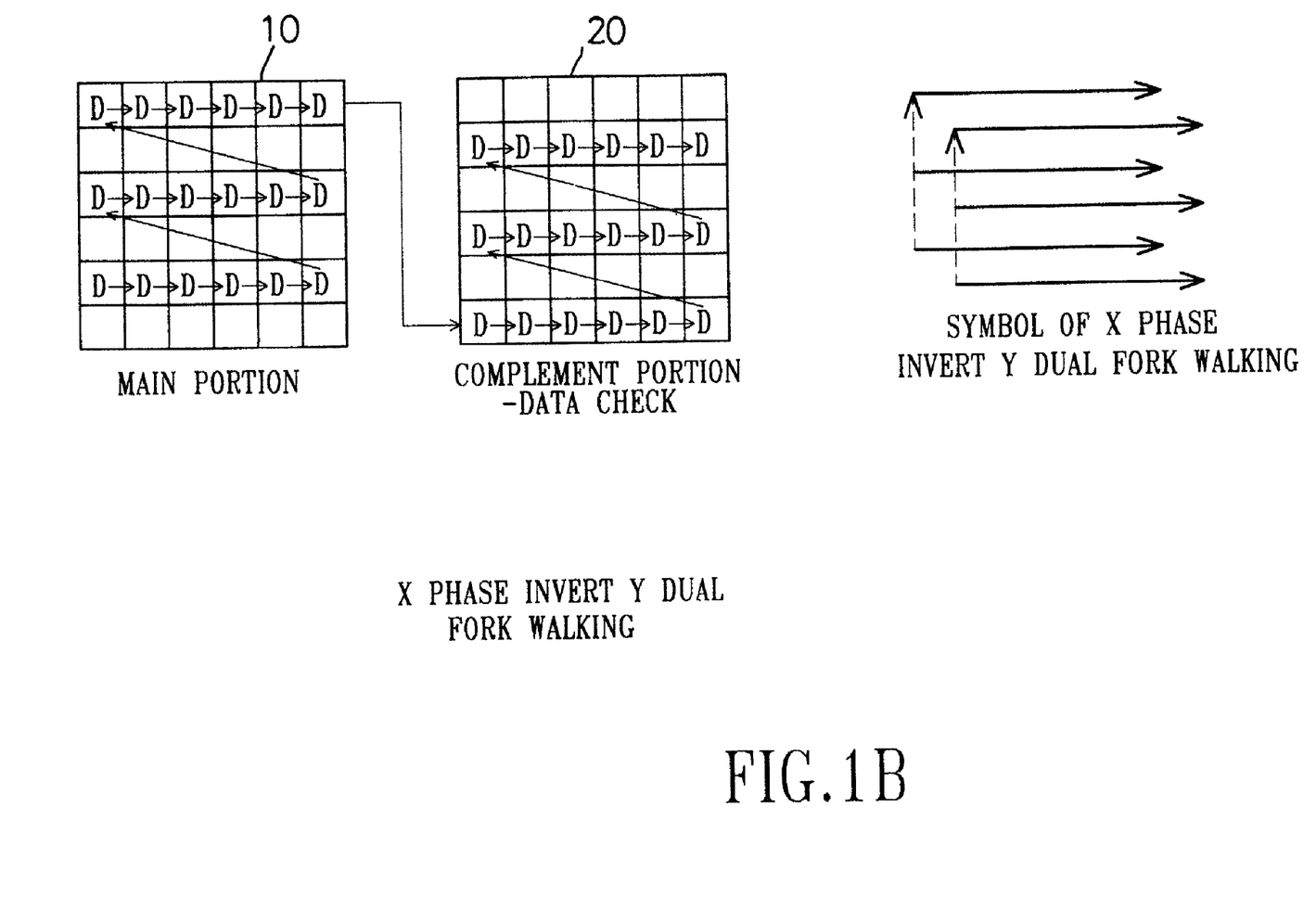

In a second embodiment of the memory interlace-checking method shown in FIG. 1B, data access commands are first performed on the odd rows, and the data in the even rows are read out to see if they are affected. The only difference from FIG. 1A is that the row to row sequence of accessing the memory is from bottom to top rather then top to bottom as in the first embodiment. The same effects can be achieved using the second embodiment.

Figure 2A:
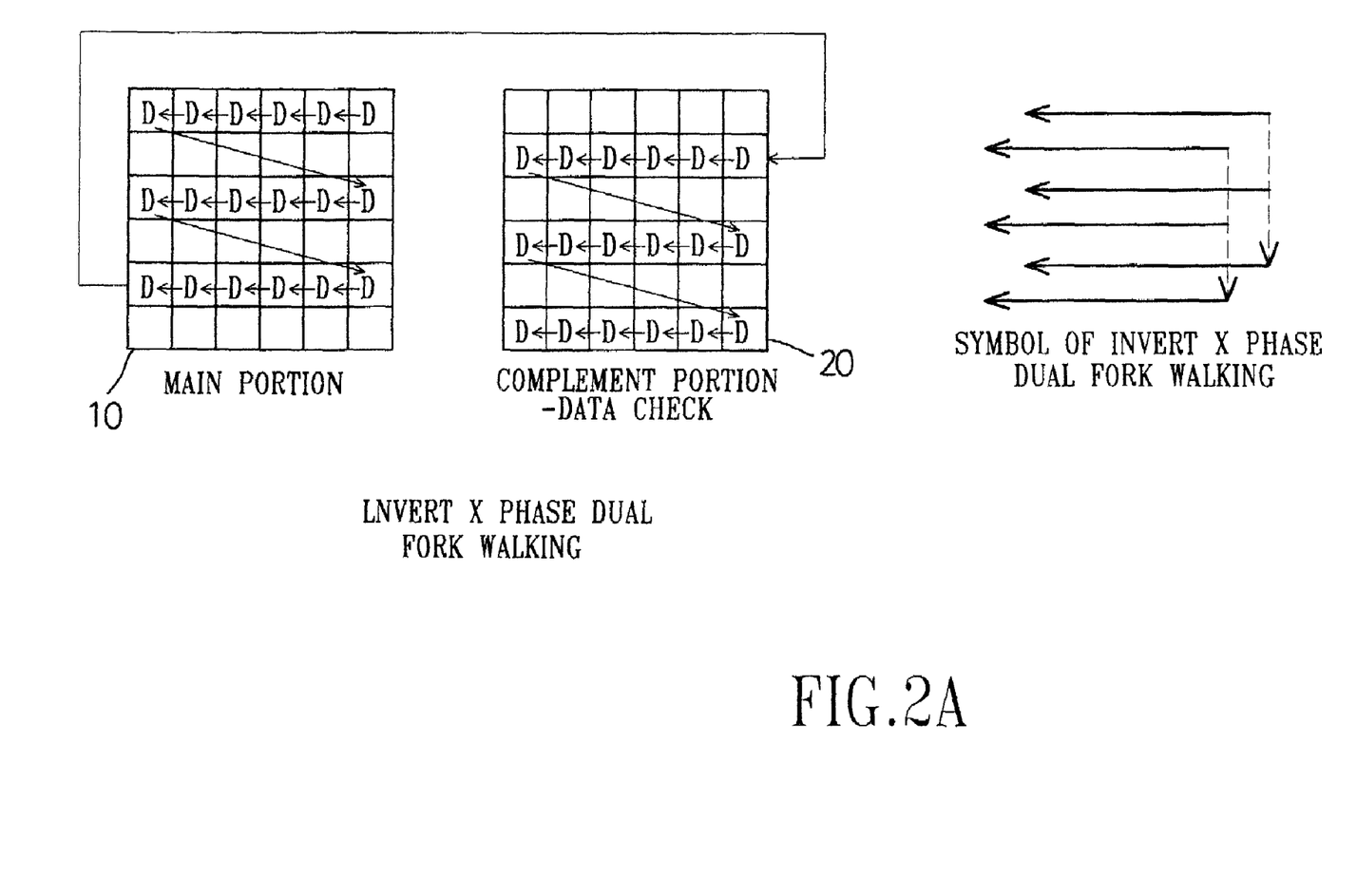
FIGS. 2A and 2B is a diagram of a second embodiment of the memory interlace-checking method in accordance with the present invention using right to left passes.
Figure 2B:
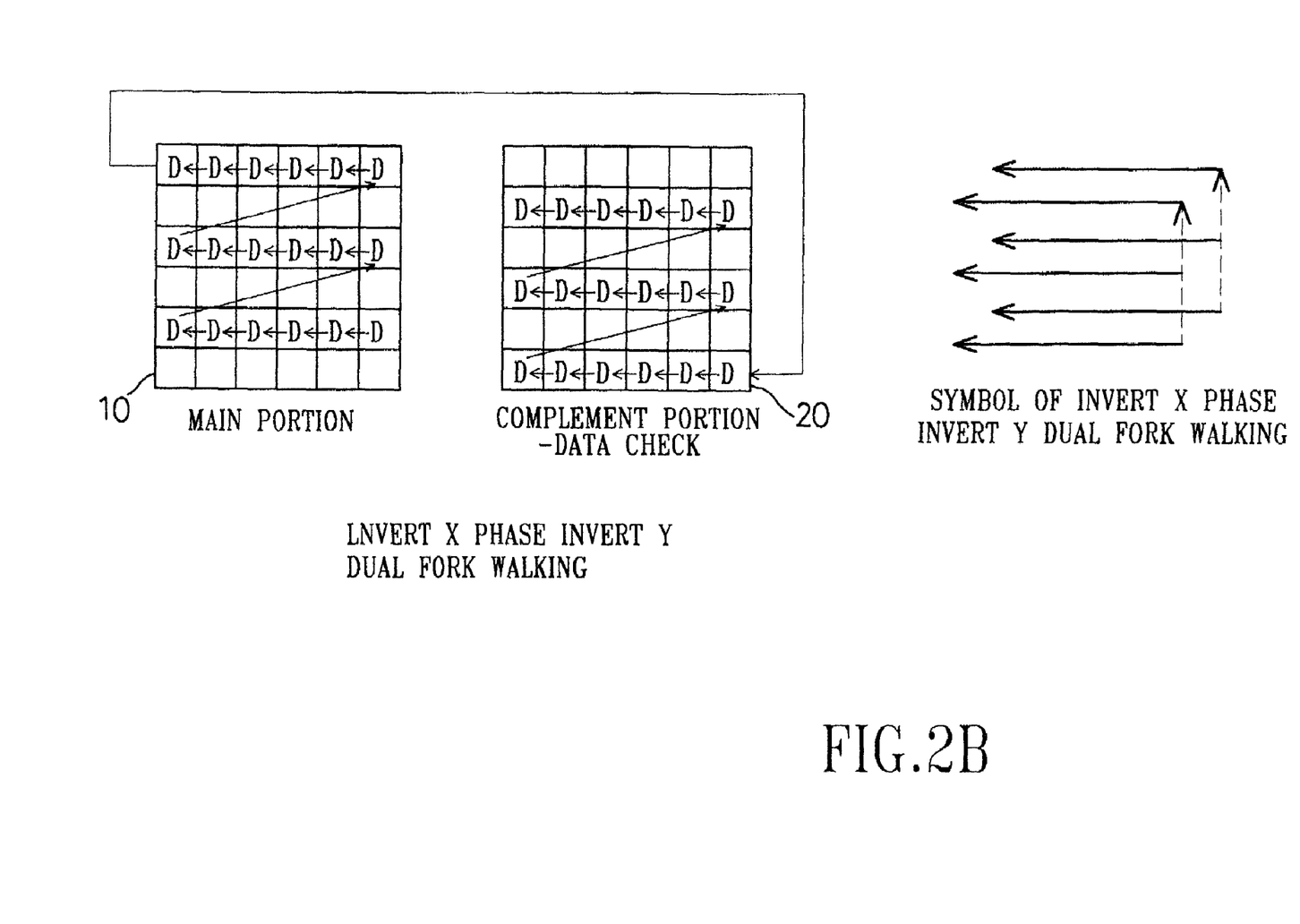

FIGS. 2A and 2B depict a method similar to the method depicted in FIGS. 1A and 1B. The difference between the embodiment depicted in FIG. 2 the embodiment depicted in FIG. 1 is the right-to-left memory access within each row.

Figure 3A:
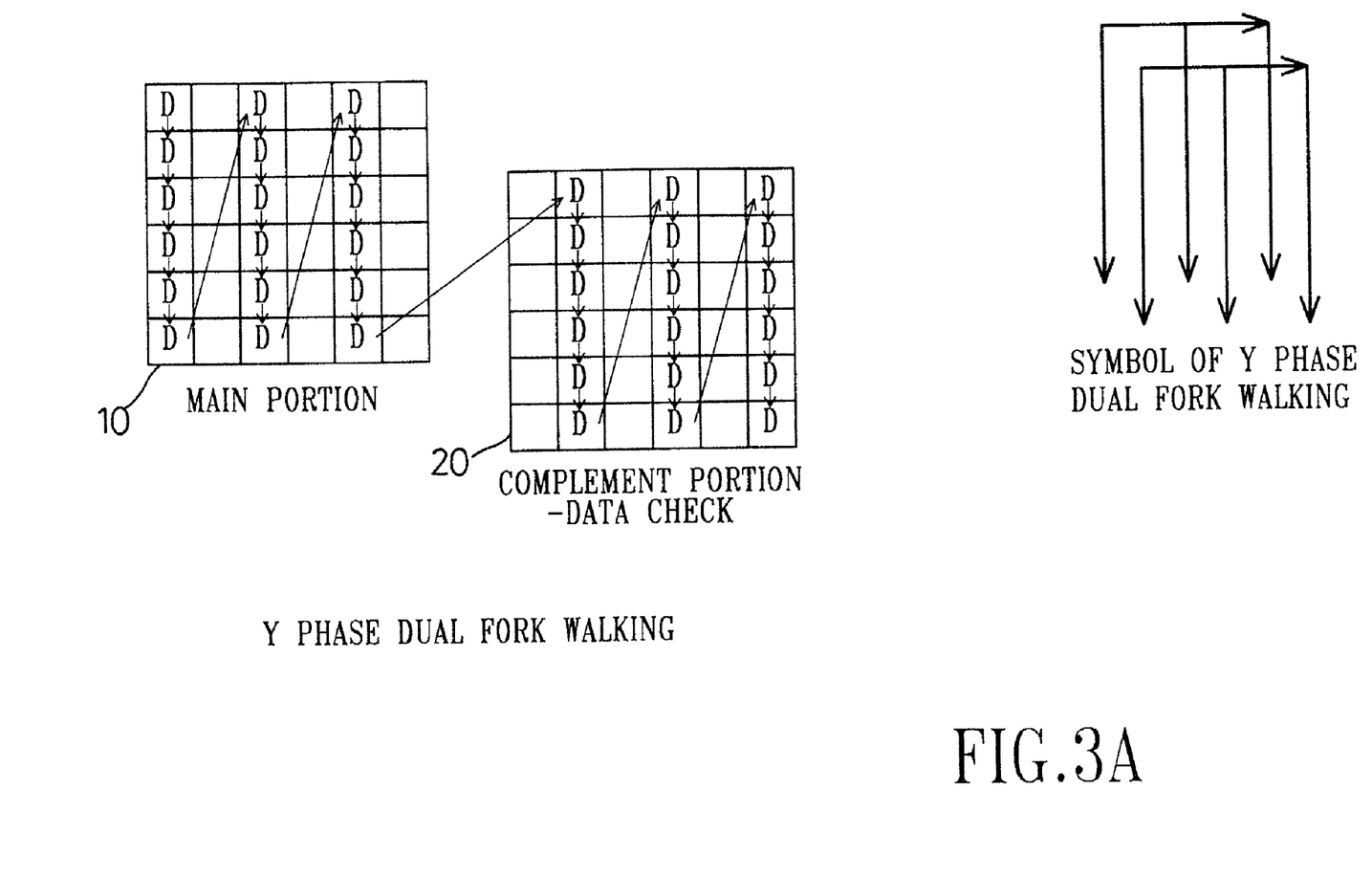
FIGS. 3A and 3B is a diagram of a third embodiment of the memory interlace-checking method in accordance with the present invention using top to bottom passes.
Figure 3B:
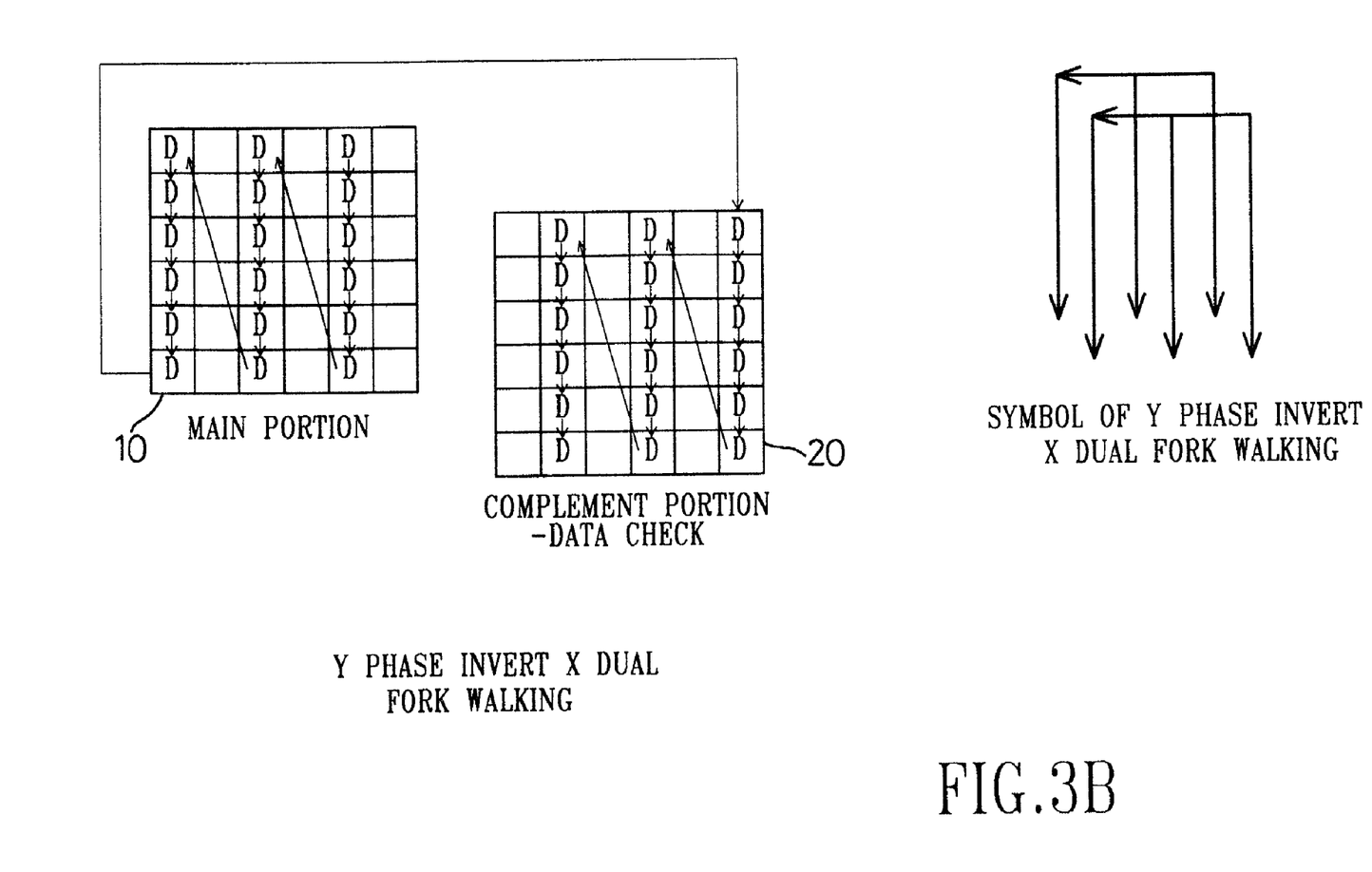
Figure 4A:
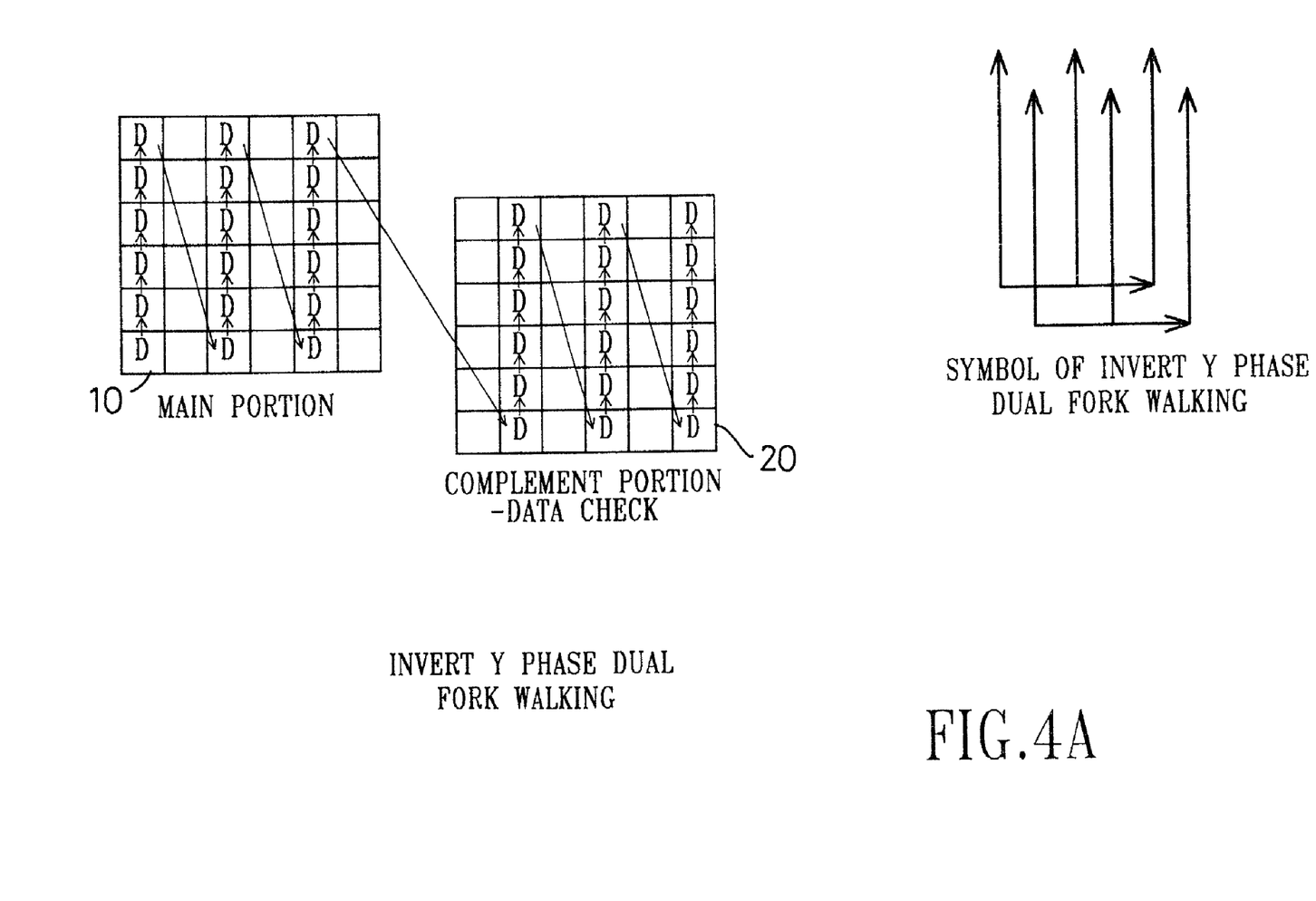
FIGS. 4A and 4B is a diagram of a fourth embodiment of the memory interlace-checking method in accordance with the present invention using bottom to top passes.
Figure 4B:
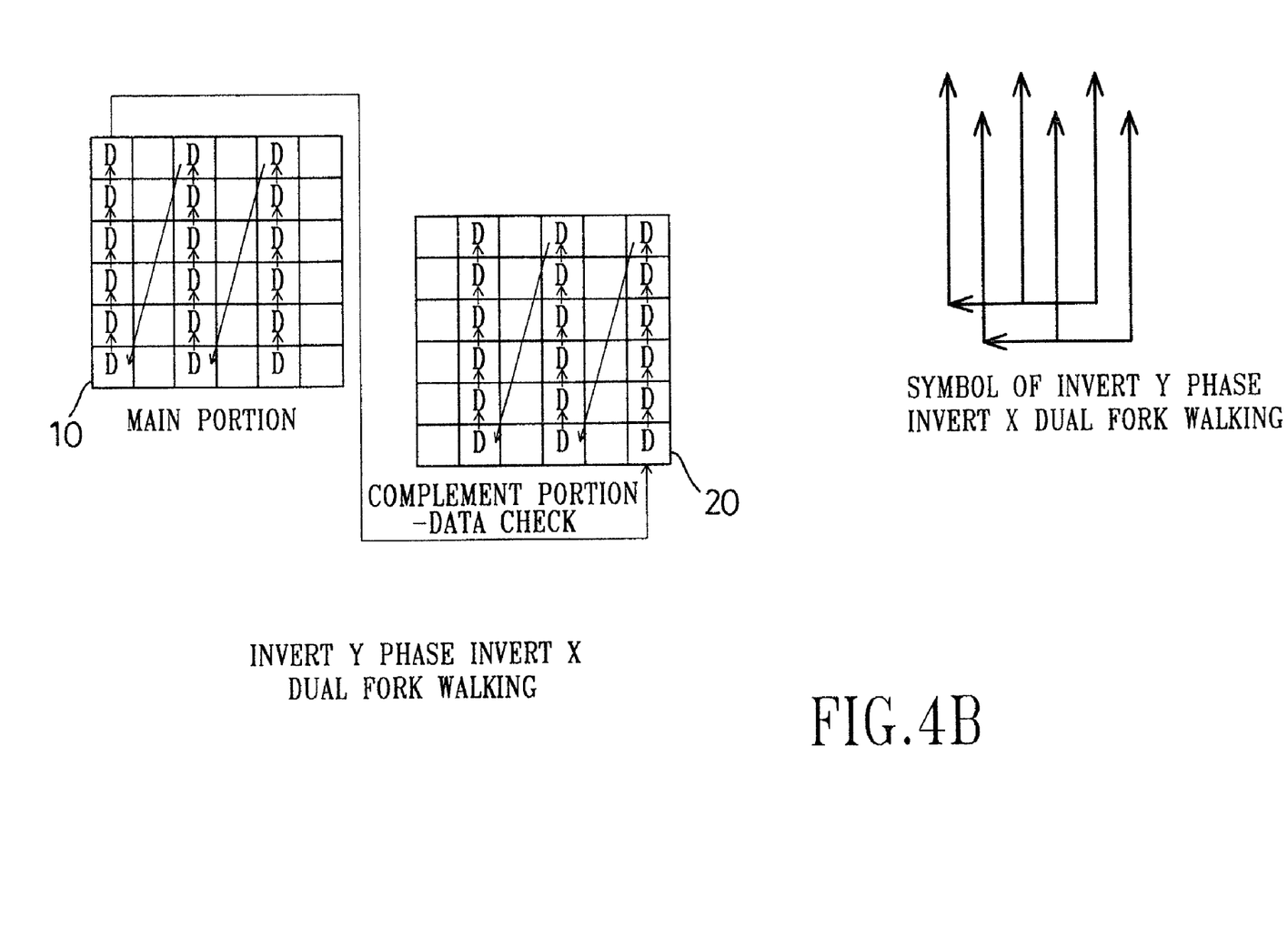
Figure 5:
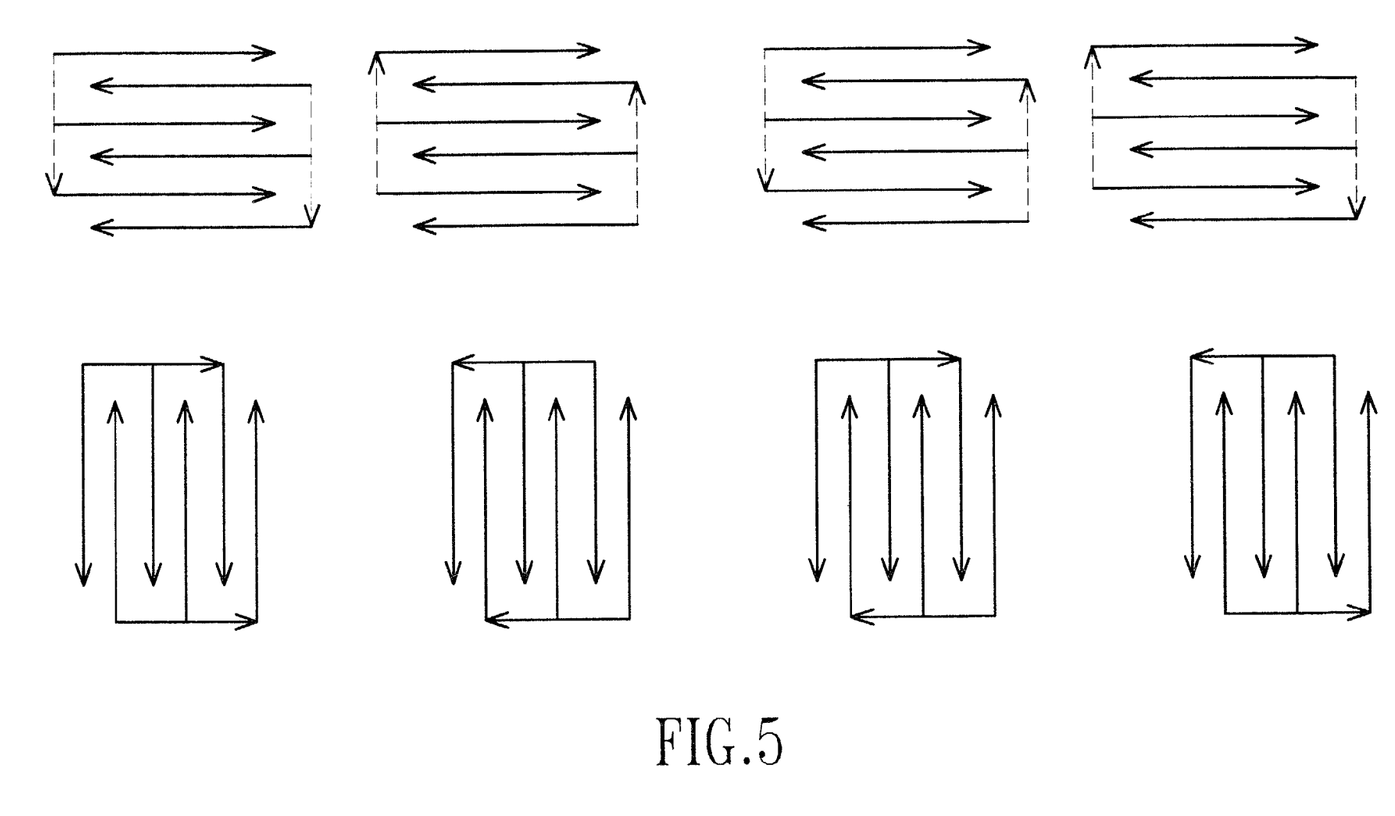
FIG. 5 are diagrams of other possible embodiments of the memory interlace-checking method in accordance with the present invention using passes in opposite directions.

The embodiments of the method depicted in FIGS. 3A and 3B first access the odd columns and check the even columns with individual memory locations in a column sequentially accessed from top to bottom. The embodiments of the method depicted in FIGS. 4A and 4B are similar to the embodiments in FIGS. 3A and 3B, but differ in that individual accessing of memory locations within a column progresses from bottom-to-top in FIGS. 4A and 4B rather than top-to-bottom as in the embodiments in FIGS. 3A and 3B. Furthermore, various methods shown in FIG. 5 are also feasible schemes of the invention. Since the detection methods disclosed herein only differ in the memory accessing schemes, the invention not only applies to current DRAM but also to the new generation of DDR-DRAM and RDRAM.

In summary, the present invention provides a new memory check method that is different from the continuous memory accessing in the prior art. Through the division of memory into rows or columns, reading, writing, or refreshing command actions are imposed on odd or even rows or columns, which induces signals and EMI on the neighboring rows or columns yet to be been accessed. Such phenomena may weaken the already weak memory units so that these memory units can be detected in the data checking step.

Certain variations would be apparent to those skilled in the art, which variations are considered within the spirit and scope of the claimed invention.

What is claimed is:

1. A memory interlace-checking method to doted weakened memory in a memory array composed of odd and even addresses, the method comprising:
   sequentially performing accessing commands on the odd addresses in the memory array; and
   sequentially performing data checking commands on the even addresses in the memory array that are complementary to the odd addresses.

2. The method of claim 1, wherein the odd and even addresses are memory rows.

3. The method of claim 1, wherein the odd and even addresses are memory columns.

4. A memory interlace-checking method to detect weakened memory, the method comprising:
   executing a test program, wherein the testing program has:
   at least a portion of main address accessing data, wherein the main address accessing data contains command actions; and
   at least a portion of secondary address accessing data, which is at least partially complementary to the portion of main address accessing data, wherein the secondary address accessing data contains checking actions.

5. A memory interlace-checking method to detect weakened memory in a memory array composed of odd and even addresses, the method comprising:
   sequentially performing accessing commands on the even addresses in the memory array; and
   sequentially performing data checking commands on the odd addresses in the memory array that are complementary to the even addresses.

6. The method of claim 5, wherein the odd and even addresses are memory rows.

7. The method of claim 5, wherein the odd and even addresses are memory columns.

* * * * *